United States Patent
Eid et al.

(10) Patent No.: US 12,519,073 B2
(45) Date of Patent: Jan. 6, 2026

(54) CONFORMAL POWER DELIVERY STRUCTURES OF 3D STACKED DIE ASSEMBLIES

(71) Applicant: INTEL CORPORATION, Santa Clara, CA (US)

(72) Inventors: Feras Eid, Chandler, AZ (US); Aleksandar Aleksov, Chandler, AZ (US); Adel Elsherbini, Chandler, AZ (US); Henning Braunisch, Phoenix, AZ (US)

(73) Assignee: Inte Corporation, Santa Clara, CA (US)

( * ) Notice: Subject to any disclaimer, the term of this patent is extended or adjusted under 35 U.S.C. 154(b) by 927 days.

(21) Appl. No.: 17/485,235

(22) Filed: Sep. 24, 2021

(65) Prior Publication Data
US 2023/0098957 A1    Mar. 30, 2023

(51) Int. Cl.
*H01L 23/00* (2006.01)

(52) U.S. Cl.
CPC .............. *H01L 24/24* (2013.01); *H01L 24/19* (2013.01); *H01L 24/20* (2013.01); *H01L 2224/2101* (2013.01); *H01L 2224/2105* (2013.01); *H01L 2224/211* (2013.01); *H01L 2224/214* (2013.01); *H01L 2224/24221* (2013.01); *H01L 2924/182* (2013.01); *H01L 2924/186* (2013.01)

(58) Field of Classification Search
CPC ......... H01L 24/24; H01L 24/19; H01L 24/20; H01L 24/13; H01L 24/16; H01L 24/17; H01L 2224/2101; H01L 2224/2105; H01L 2224/211; H01L 2224/214; H01L 2224/24221; H01L 2924/182; H01L 2924/186; H01L 25/50; H01L 25/18; H01L 23/562; H01L 2225/06513; H01L 2225/06517; H01L 2225/06548; H01L 2225/06589; H01L 2225/0652
See application file for complete search history.

(56) References Cited

U.S. PATENT DOCUMENTS

2016/0343666 A1*  11/2016  Deshpande ......... H01L 23/5383

* cited by examiner

*Primary Examiner* — Marlon T Fletcher
*Assistant Examiner* — Christina A Sylvia
(74) *Attorney, Agent, or Firm* — Alliance IP, LLC

(57) ABSTRACT

A conformal power delivery structure, a three-dimensional (3D) stacked die assembly, a system including the 3D stacked die assembly, and a method of forming the conformal power delivery structure. The power delivery structure includes a package substrate, a die adjacent to and electrically coupled to the package substrate; a first power plane adjacent the upper surface of the package substrate and electrically coupled thereto; a second power plane at least partially within recesses defined by the first power plane and having a lower surface that conforms with the upper surface of the first power plane; and a dielectric material between the first power plane and the second power plane.

20 Claims, 11 Drawing Sheets

CONFORMAL POWER DELIVERY STRUCTURES OF 3D STACKED DIE ASSEMBLIES

BACKGROUND

In today's three-dimensional (3D) stacked die assemblies, mold compound is used to encapsulate the dies in the different 3D levels. This thickness of the mold is typically orders of magnitude larger than that of the conductive traces or power planes within the various layers of the 3D stack. This architecture suffers from thermal management challenges, as the mold compound usually has a low thermal conductivity (usually less than ~1 W/m-K) and can cause poor heat transfer from the dies, especially those in the bottom levels of the 3D structure (adjacent the package substrate) in a direction toward the thermal solution at the top of the 3D stack, such as a thermal interface material (TIM). Moreover, power delivery connections to the top dies are usually always implemented in the form of through mold vias (TMVs) in the mold layer or through silicon vias (TSVs) in the bottom dies.

DETAILED DESCRIPTION

Some embodiments propose replacing some or all of the mold compound in a 3D stacked die assembly (or "3D die stack" or "3D stack") with a thermally and electrically conductive material (e.g. copper), which is manufactured using high throughput additive manufacturing (HTAM), such as cold spray. The HTAM material thus provided improves thermal management of 3D stacks while enabling power delivery between the package substrate of the 3D stack and the dies thereof at Levels 2 and above (top dies).

Some embodiments propose providing a conformal power delivery structure that includes two or more power planes formed on one another, where at least one die is embedded at a level of the conformal power delivery structure (instead of being embedded in a mold compound). The conformal power delivery structure may include a top/second power plane layer deposited (e.g., via a cold spray deposition process) onto a lower/first power plane layer in such a way the top power plane layer conforms with the shape of the lower power plane layer. Each power plane layer may be separated by and insulated with a thin dielectric material. For instance, the dielectric material layer may be on the order of tens to thousands of nanometers (nm) as opposed to the "anti-pads" used in parallel plane structures that are on the order of approximately 10-100 micrometers (um).

Advantageously, embodiments improve thermal management of a 3D stacked die assembly and enable power delivery to top dies (dies at Levels 2 or above of the 3D stack) through the HTAM layer itself, reducing the number of through mold vias (TMVs) or through silicon vias (TSVs) required. Embodiments may thus bring about significant improvements in the thermal conductivity when compared with standard mold compounds, which can improve the thermal spreading performance. In some cases, the same number of power planes may also be implemented in less volume than a traditional parallel power plane structure.

A conformal power delivery structure including the HTAM layer in accordance with the present disclosure may further advantageously enable self-aligned, ultra-small anti-pads to achieve better electrical performance than typical parallel power plane structures. For instance, embodiments of the present disclosure may enable much better lateral electrical resistance. Additionally, since there is a relatively thin layer of dielectric between the power planes (as described further below), the lateral inductance may also be significantly improved, helping with transient response characteristics.

Figure 1:
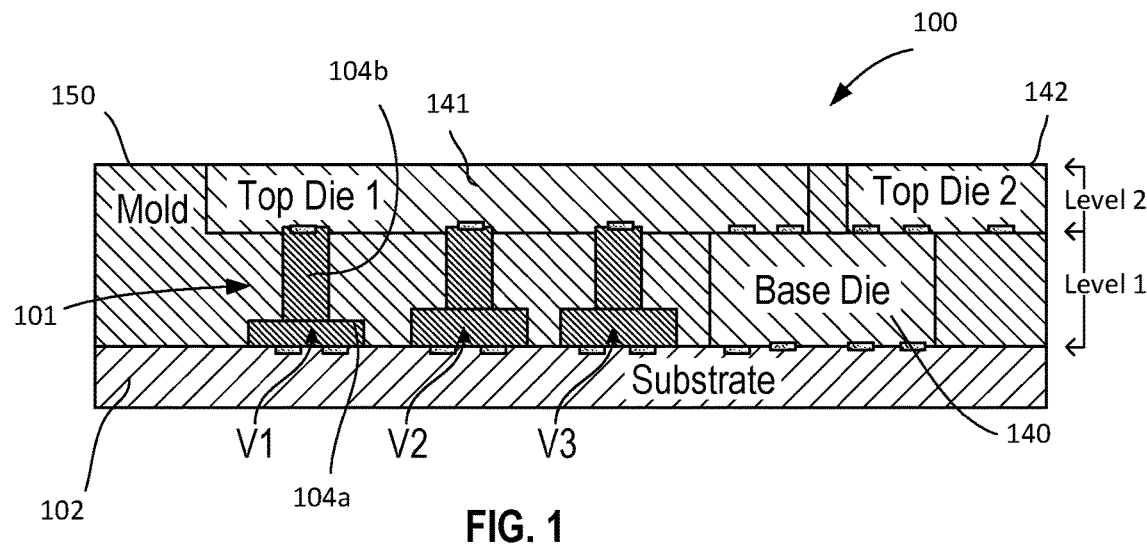
FIG. 1 illustrates an example system that includes a first level of a 3D stacked die including a power plane and a die therein embedded in a mold compound.

FIG. 1 shows a system 100 that includes a portion of a 3D stacked die assembly including a package substrate 102, and a material Level 1 layer on the package substrate 102. Level 1 layer includes a power plane 101, which is shown as being adapted to be biased at three different voltages levels V1, V2 and V3 as supplied by circuitry of package substrate 102. Level 1 further includes a base die 140 therein, electrically coupled between the substrate 102 and material Level 2. The first power plane includes a series of interconnects 104a, and vias 104b. Level 2 includes two top dies 141 and 142. Level 1 and Level 2 include the power plane 101 and components such as dies 140, 141 and 142 encapsulated in a mold compound 150.

In a 3D stacked die assembly such as the one shown in FIG. 1, mold compound is used to encapsulate the dies in the different 3D levels. Such an architecture suffers from thermal management challenges as the mold compound usually has a low thermal conductivity (usually less than about 1 W/m-K) and can cause poor heat transfer from the dies especially those in the bottom levels to the thermal solution at the top of the assembly, such as a TIM (not shown). Moreover, power delivery connections to the top dies are usually always implemented as through mold vias (TMVs) in the mold layer or through silicon vias (TSVs) in the bottom dies.

Figure 2:
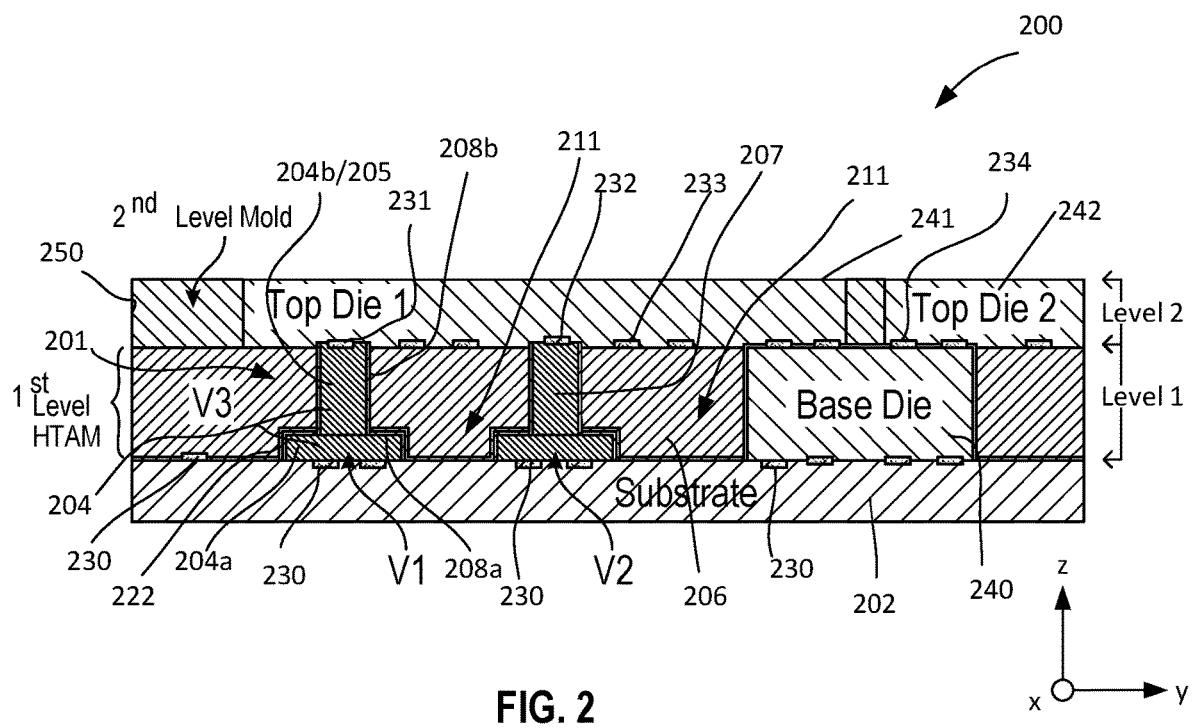
FIG. 2 illustrates an example system that includes a conformal power delivery structure in accordance with a first embodiment of the present disclosure.

FIG. 2 illustrates an example system 200 that includes a conformal power delivery structure 201 in accordance with a first embodiment of the present disclosure. In particular, the example system 200 includes the conformal power delivery structure 201 which includes a first power plane 204 and a second power plane/HTAM layer 206 formed on the first power plane 204, with a dielectric layer 208 between the first power plane 204 and second power plane 206. The dielectric layer may include a first portion 208a on the interconnects 204a, and a second portion 208b in the form of dielectric liners along sidewalls of vias 204b/205 and 207. The conformal power delivery structure 201 may be formed as described further below with respect to FIGS. 6A and 6B, or in another manner.

HTAM layer 206 replaces the mold compound in Level 1 shown in FIG. 1, which is at the base die level, improving heat spreading and heat removal as compared with the configuration of FIG. 1. The HTAM material (e.g. Cu, with thermal conductivity of about 400 W/m-K) is orders of magnitude more thermally conductive than typical mold compounds (with thermal conductivity less than about 1 W/m-K). The HTAM material, being electrically conductive (unlike mold compounds), is also electrically coupled to traces in the substrate 202 that are at a voltage level V3, and imparts this voltage to specific connections in the top dies 241 and 242, whereas voltage levels V1 and V2 are imparted to the top dies through vias 204b/205 and 207 formed within (and electrically insulated from) this HTAM layer. As compared to the architecture in FIG. 1, some embodiments advantageously reduce the number of TMVs between the substrate and the top dies, and enable more efficient power delivery.

As shown, the first power plane 204 of the conformal power delivery structure 201 is defined by a first electrically conductive portion (e.g., metal or a material comprising metal) including conductive traces or interconnects 204a and vias 204b, all at the $1^{st}$ Level or Level 1 layer of a 3D microelectronic stack. As such, the power delivery structure 201 has a non-flat upper surface that defines one or more recesses 211, and the second power plane/HTAM layer 206 is defined by a second electrically conductive portion (e.g., metal or a material comprising metal) that is within the recesses 211 such that the lower surface of the second electrically conductive portion generally conforms with the non-flat upper surface of the first electrically conductive portion and the planes 204, 206 along a x-y direction (see legend for example in FIG. 2) are co-planar with one another within the areas of the recesses 211.

As used herein, a first surface generally conforming to a second surface may refer to the first surface having the same or very similar shape as the second surface, with the first surface following along the surface of the second surface. For instance, in the example shown, the lower surface of the second power plane/HTAM layer 206 (the surface facing the first power plane 204) has the same shape or contour as the upper surface of the first power plane 204 (the surface facing the second power plane/HTAM layer 206). Thus, the dielectric layer 208 between the planes 204, 206 has the same shape as the upper surface of plane 204 and lower surface of plane 206. However, in some embodiments, due to manufacturing differences, tolerances, dielectric (or other layer) deposition methods, the conforming surfaces may not have the exact same shape as one another, but they may still be considered to be conforming in the sense that the lower surface of the upper plane 206 generally follows along with the upper surface of the plane 204 (and/or the dielectric layer 208 to the extent its shape is slightly different from that of the upper surface of the plane 204).

The second power plane/HTAM layer 206 defines openings therethrough in which vias 204b of the first power plane 204, corresponding to vias 204b/205 and 207 are disposed.

Although dielectric layer 208 is shown in FIG. 2 (and the same goes for dielectric layers 308, 408 and 708 of FIGS. 3, 4 and 7 to be described below) to be merely providing a barrier between first power plane 204 and second power plane/HTAM layer 206, and not being provided on the top surface of the substrate 202 within the recesses 211, it is to be understood that this dielectric layer 208 may, if needed, extend onto this upper surface in order to insulate the second power plane/HTAM layer 206 from power planes within the substrate 202 itself. In the shown embodiments of FIGS. 2-4 and 7, it is assumed that the upper surface of substrate 202 is in any event insulative, to the extent that any power delivery through the same is to be established by way of electrical contacts 230 as shown.

As used herein, the terms "upper"/"lower" or "above"/ "below" may refer to relative locations of an object (e.g., the surfaces described above), especially in light of examples shown in the attached figures, rather than an absolute location of an object. For example, an upper surface of an apparatus may be on an opposite side of the apparatus from a lower surface of the object, and the upper surface may be facing upward generally only when viewed in a particular way. As another example, a first object above a second object may be on or near an "upper" surface of the second object rather than near a "lower" surface of the object, and the first object may be truly above the second object only when the two objects are viewed in a particular way.

In the example shown, the conformal power delivery structure 201 allows for power delivery to component circuitry of top dies 241 and 242 within the $2^{nd}$ Level, or Level 2 of the system 200. An electrical connection to dies 241 and 242 may further take place through a base die 240, which is embedded within Level 1 of the 3D stack system. The base die is connected to circuitry internal to the substrate 202 by way of contacts 230, and to dies 241 and 242 through contacts 234. Dies 241 and 242 are shown embedded in Level 2 within a molded compound 250.

Each of the shown dies may include one or more circuitry components, such as a voltage regulator circuitry, memory circuitry, and/or processor circuitry. In some instances, the dies in embodiments may include only one type of circuitry components thereon. In other instances, each of the different circuitry components may be housed in a separate die instead of one die as shown. In some embodiments, the die may be implemented as a die stack, or may be implemented as several different dies on an organic or inorganic interposer apparatus (e.g., with each die comprising different circuitry).

The power delivery to the die 241 is from two power planes and supplies three different voltages, (e.g., V1, V2 and V3 in the example shown) through the contacts or pads 230 on the substrate 202, through the first and second power delivery planes 204 and 206, and through contacts or pads 231 (for V1), 232 (for V2) and 233 (for V3). In some cases, the dies herein may include voltage regulator circuitry (to convert and/or regulate the voltages provided by the first and second power plane/HTAM layers of the conformal power delivery structure 201.

System 200 additionally includes a buffer layer 222 at a lower surface of the second power plane/HTAM layer. The buffer layer 222 may be disposed between and adjacent to the upper surface of the substrate 202 and the lower surface of the second power plane/HTAM layer 206. The buffer layer may optionally extend onto side walls and portions of the upper surface of the interconnects 204a. Alternatively, there may be intervening layers between buffer layer 222 and any one of the second power plane/HTAM layer 206, the substrate 202, or surfaces of the interconnect 204a.

Although described herein as being power "planes", it will be understood that the power planes of the present disclosure may not be planar in the geometric sense (e.g., completely flat in one plane like traditional power planes). In addition, although shown as formed in a particular way (e.g., with two power planes), the conformal power delivery structure 201 may be formed in any suitable manner in accordance with the examples described herein (e.g., with three or more power planes, or with different via shapes, or no vias). Further, although shown as being located in a system that is part of a 3D die stack architecture, the conformal power delivery structure 201 may be included in any suitable location within a package. The power planes may also be used to deliver power from one die to another die on the same package (e.g., from a separate voltage regulator die to a processor die) or from outside the package (main board, battery, etc.) to the package and then to the die(s).

Figure 3:
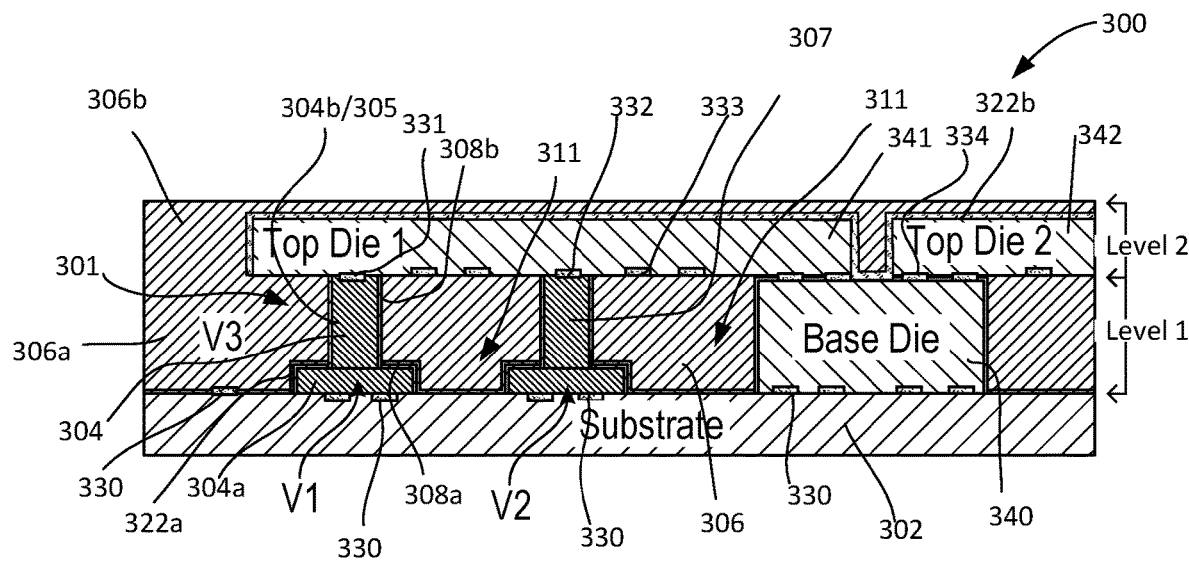
FIG. 3 illustrates an example system that includes a conformal power delivery structure in accordance with a second embodiment of the present disclosure.

FIG. 3 illustrates an example system 300 that includes a conformal power delivery structure 301 in accordance with embodiments of the present disclosure. FIG. 3 is similar to FIG. 2, except that, in FIG. 3, Level 2 of the 3D die stack further includes a part of the conformal power structure, in this case, conformal power structure 301. Components in FIG. 3 have been referred to in that figure with like reference numerals as those used to refer to corresponding components in FIG. 2. Therefore, certain details and descriptions regarding those components have been omitted in the discussion of FIG. 3.

In this embodiment, the HTAM material extends above the top dies to provide some heat spreading. When mold compound is used in the second level, it usually cannot extend beyond the top surface of the top dies since its thermal conductivity (<1 W/m-K) is much less than that of Si (about 120 W/m-K) and acts as a thermal barrier for heat transfer up from the die to a cooling solution such as a TIM (not shown). However, if an HTAM material such as Cu is used, its thermal conductivity (about 400 W/m-K) is much higher than that of Si, and can thus provide heat spreading benefits by extending above the top dies (for example, by 50-300 μm).

The example system 300 includes the conformal power delivery structure 301 which includes a first power plane 304 and a second power plane/HTAM layer 306 formed on the first power plane 304, with a dielectric layer 308 between the first power plane 304 and second power plane/HTAM layer 306. Second power plane 306 includes a first portion 306a that extends at Level 1 of the 3D stack, and a second portion 306b that extends at Level 2 of the 3D stack beyond dies 341 and 342 embedded at Level 2.

As shown, the first power plane 304 of the conformal power delivery structure 301 is defined by a first electrically conductive portion (e.g., metal or a material comprising metal) including conductive traces or interconnects 304a and vias 304b, all at the 1$^{st}$ Level or Level 1 layer of a 3D microelectronic stack. As such, the power delivery structure 301 has a non-flat upper surface that defines one or more recesses 311, and the second power plane/HTAM layer 306 is defined by a second electrically conductive portion (e.g., metal or a material comprising metal) that is within the recesses 311 such that the lower surface of first portion 306a of the second electrically conductive portion 306 generally conforms to the non-flat upper surface of the first electrically conductive portion, and further such that the first power plane 304 and the first portion 306a of the second power plane/HTAM layer 306 are co-planar with one another along areas of the recesses along a x-y direction (see legend for example in FIG. 2).

The first portion 306a of second power plane/HTAM layer 306 defines openings therethrough in which the vias 304b of the first power plane 304, corresponding to vias 304b/305 and 307 are disposed. The second portion 306b of the second power plane/HTAM layer 306 encapsulates and extends above dies 341 and 342.

Similar to FIG. 2, in the example of FIG. 3, the conformal power delivery structure 301 allows for power delivery to component circuitry of top dies 341 and 342 within the 2$^{nd}$ Level, or Level 2 of the system 300. An electrical connection to dies 341 and 342 may further take place through a base die 340, which is embedded within Level 1 of the 3D stack system. The base die is connected to circuitry internal to the substrate 302 by way of contacts 330, and to dies 341 and 342 through contacts 334. Dies 341 and 342 are shown embedded in HTAM layer 306.

The power delivery to the die 341 is from two power planes and supplies three different voltages, (e.g., V1, V2 and V3 in the example shown) through the contacts or pads 330 on the substrate 302, through the first and second power delivery planes 304 and 306, and through contacts or pads 331 (for V1), 332 (for V2) and 333 (for V3). Although not shown in FIG. 3, one or more contacts or pads could be disposed to connect the second power plane/HTAM layer 306 to the base die 340 at a top region thereof to the second portion 306b of the second power plane/HTAM layer 306.

System 300 additionally includes two sets of buffer layers 322a and 322b. Buffer layer 322a is, similar to buffer layer 222 of FIG. 2, at a lower surface of the second power plane/HTAM layer 306. The buffer layer 322a may be disposed between and adjacent to the upper surface of the substrate 302 and the lower surface of the second power plane/HTAM layer 306. The buffer layer 322a may optionally extend onto side walls and portions of the upper surface of the interconnects 304a. Alternatively, there may be intervening layers between buffer layer 322a and any one of the second power plane/HTAM layer 306, the substrate 302, or surfaces of the interconnect 304a. Buffer layer 322b is shown as being between the surfaces of dies 340, 341 and 342 and the second portion 306b of the second power plane/HTAM layer 306. The buffer layer 322b may optionally extend across an upper surface of the first portion 306a of the second power plane/HTAM layer 306.

Figure 4:
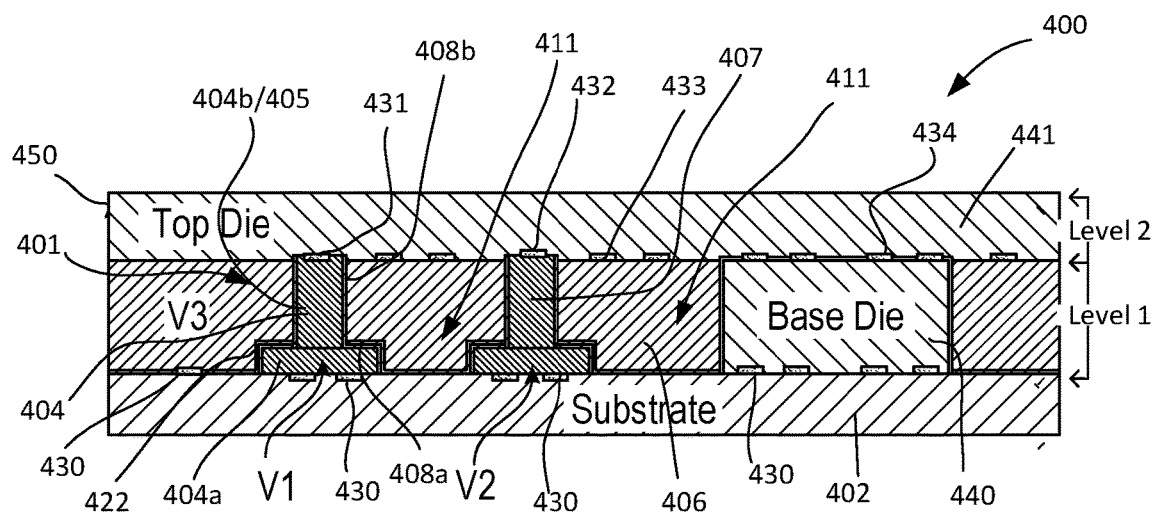
FIG. 4 illustrates an example system that includes a conformal power delivery structure in accordance with a second embodiment of the present disclosure.

FIG. 4 illustrates an example system 400 that includes a conformal power delivery structure 401 in accordance with a third embodiment of the present disclosure. FIG. 4 is similar to FIG. 2, except that, in FIG. 4, Level 2 of the 3D die stack above the conformal power structure 401 is taken up entirely by a top die 441. Thus, in FIG. 4, a single large top die that covers the entire 3D stack x-y area is used, occupying all of Level 2 and not leaving room for any mold compound or HTAM material in this second level. Components in FIG. 4 have been referred to in that figure with like reference numerals as those used to refer to corresponding components in FIG. 2. Therefore, certain details and descriptions regarding those components have been omitted in the discussion of FIG. 4.

The example system 400 includes the conformal power delivery structure 401 which includes a first power plane 404 and a second power plane/HTAM layer 406 formed on the first power plane 404, with a dielectric layer 408 between the first power plane 404 and second power plane/HTAM layer 406.

As shown, the first power plane 404 of the conformal power delivery structure 401 is defined by a first electrically conductive portion (e.g., metal or a material comprising metal) including conductive traces or interconnects 404a and vias 404b, all at the $1^{st}$ Level or Level 1 layer of a 3D microelectronic stack. As such, the power delivery structure 401 has a non-flat upper surface that defines one or more recesses 411, and the second power plane/HTAM layer 406 is defined by a second electrically conductive portion (e.g., metal or a material comprising metal) that is within the recesses 411 such that the lower surface of the second electrically conductive portion 406 generally conforms to the non-flat upper surface of the first electrically conductive portion, and further such that the first power plane 404 and the second power plane/HTAM layer 406 are co-planar with one another along areas of the recesses along a x-y direction (see legend for example in FIG. 2).

The second power plane/HTAM layer 406 defines openings therethrough in which vias 404b of the first power plane 404, corresponding to vias 404b/405 and 407 are disposed.

In the example of FIG. 4, the conformal power delivery structure 401 allows for power delivery to component circuitry of top die 441 within the $2^{nd}$ Level, or Level 2 of the system 400. An electrical connection to die 441 may further take place through a base die 440, which is embedded within Level 1 of the 3D stack system. The base die is connected to circuitry internal to the substrate 402 by way of contacts 430, and to die 441 through contacts 434.

The power delivery to the die 441 is from two power planes and supplies three different voltages, (e.g., V1, V2 and V3 in the example shown) through the contacts or pads 430 on the substrate 402, through the first and second power delivery planes 404 and 406, and through contacts or pads 431 (for V1), 432 (for V2) and 433 (for V3). Although not shown in FIG. 4, the base die may be completely electrically insulated from die 441.

Referring to the power delivery structure of FIGS. 2-4, a portion of the second power plane/HTAM layer 206/306/406, or "conformal power plane" 206/306/406 may be, at least in part, provided by way of a cold spray process. Hence the second power plane/HTAM layer may be referred to as an "HTAM layer," which may include one or more layers provided through a HTAM technique, such as cold spray.

Cold spraying (CS) is a coating deposition method, where solid powders (typically about 1 to 100 microns in diameter) are accelerated in a supersonic gas jet to velocities up to about 1200 m/s. During impact with the target surface, particles undergo plastic deformation and adhere to the target surface. The solid powders of the desired material or material mixtures to be deposited in cold spray are accelerated in a carrier gas jet (e.g. compressed air or N2) by passing the jet through a converging diverging nozzle. To achieve a uniform thickness, the spraying nozzle may be scanned along the target surface. Subsequent layers of the material similarly adhere to each underlying layer upon continued jet impact, producing fast buildup (e.g. layers that are few 100s of microns thick can be deposited over an area of 100-1000 mm$^2$ in seconds). The kinetic energy of the particles, supplied by the expansion of the gas, is converted to plastic deformation energy during bonding. Unlike thermal spraying techniques, such as plasma spraying, arc spraying, flame spraying, or high velocity oxygen fuel (HVOF), the powders are in general not melted during the spraying process, thus presenting the signature physical features to be described below. Metals, polymers, ceramics, composite materials including metals and non-metals, and nanocrystalline powders can be combined as feed powder, and deposited as a composite, hybrid layer using cold spraying in a single operation.

A material structure provided by way of cold spraying (cold spray structure, which in the case of FIGS. 2-4, includes the conformal power plane 206/306/406, may present signature physical features and/or may be accompanied by signature physical features of surrounding structures, for example as discernible through a cross section viewed with the use of electron microscopy, such as a scanning electron microscopy (SEM) or transmission electron microscopy (TEM). The signature physical features may include a non-amorphous, granular microstructure including disordered or randomly distributed grains or particles. The particles may each have dimensions in the order of from 1 micron to 10s of microns up to about 100 microns, and may present substantially non-linear particle to particle interfaces, for example when viewed at high magnification as noted above, for example a magnification at a scale of about 500 nm. The particle to particle interfaces are "substantially non-linear" as compared with particle to particle interfaces of plated metal materials when viewed at a same magnification. The cold sprayed material may further have a maximum porosity of 5% throughout. Signature physical features of surrounding structures may include the presence of a buffer layer, such as buffer layer 222/322a/322b/422.

The buffer layer may be provided by way of, for example, electroplating or physical vapor deposition, and may include a first layer including, for example, titanium or tantalum, and a second layer over the first layer and disposed adjacent the cold sprayed material structure, the second layer including, by way of example, a soft metal such as indium, silver, gold, tin, lead, and related alloys. The buffer layer may, for example, include one or more of nickel (Ni), nickel vanadium (NW), or other materials, and may have a total thickness less than about 500 nm.

A cold spray structure in general is best not to be deposited directly on certain surfaces, such as dielectric surfaces of the package substrate 202/302/402, or such as semiconductor surfaces of a die, since the cold spray delivers particles at a high speed, for example supersonic speeds. Such particles may likely crater and damage a dielectric or semiconductor material. A thin buffer layer including titanium topped with gold, or titanium topped with copper would largely avoid the latter consequence, by both adhering to the dielectric or semiconductor material (e.g. by virtue of the titanium), and by providing a soft-enough layer on top that would allow for the cold spray material to be deposited on top of it without damaging the underlying dielectric or semiconductor material.

When viewed at high magnification, for example through electron microscopy, the interface between the buffer layer and the cold spray structure of the second power plane/HTAM layer/conformal power plane may present a non-flat configuration, for example as compared with an interface between power planes and the underlying dielectric. In the non-flat configuration, some particles of the cold-spray structure are at least in part embedded within indentations of the upper material of the buffer layer. It is for this reason that a soft metal used as the upper material of the buffer layer would be beneficial to receive a cold sprayed material formed thereon in an additive manner, as it would allow a secure bonding of the cold sprayed structure to the underlying layer.

Figure 5:
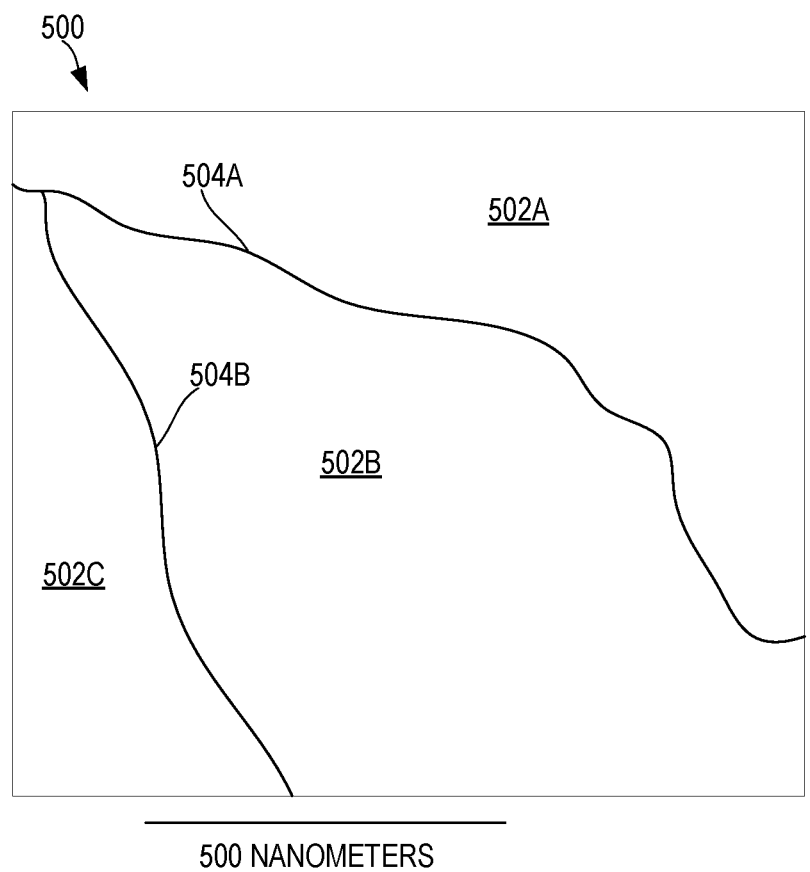
FIG. 5 illustrates a magnified view of a cold spray structure.

Referring now to FIG. 5, in one embodiment, an illustration 500 of a magnified view of a cold spray structure (such as the conformal power plane 206/306/406) is shown. The illustration 500 has a scale in the form of a line at the bottom, which has a width of 500 nanometers. The illustration shows several particles 502, such as particle 502A, particle 502B, and particle 502C. In the illustrative embodiment, each particle 502A-C has a length, width, height, and/or diameter of, e.g., 10-100 microns. Particle boundaries (such as particle boundary 504A, 504B) are present between the various particles 502A-C. The particle boundaries are visible in, e.g., a scanning electron microscope image taken of a cross-section of a cold spray structure.

Examples of HTAM materials that may be cold sprayed to provide the HTAM layer, such as the HTAM layer in the embodiments of FIGS. 2-4 described above, may include copper, aluminum, and combinations or composites including metals and non-metal particles, e.g., diamond, silicon carbide, or aluminum nitride.

Figure 6A:
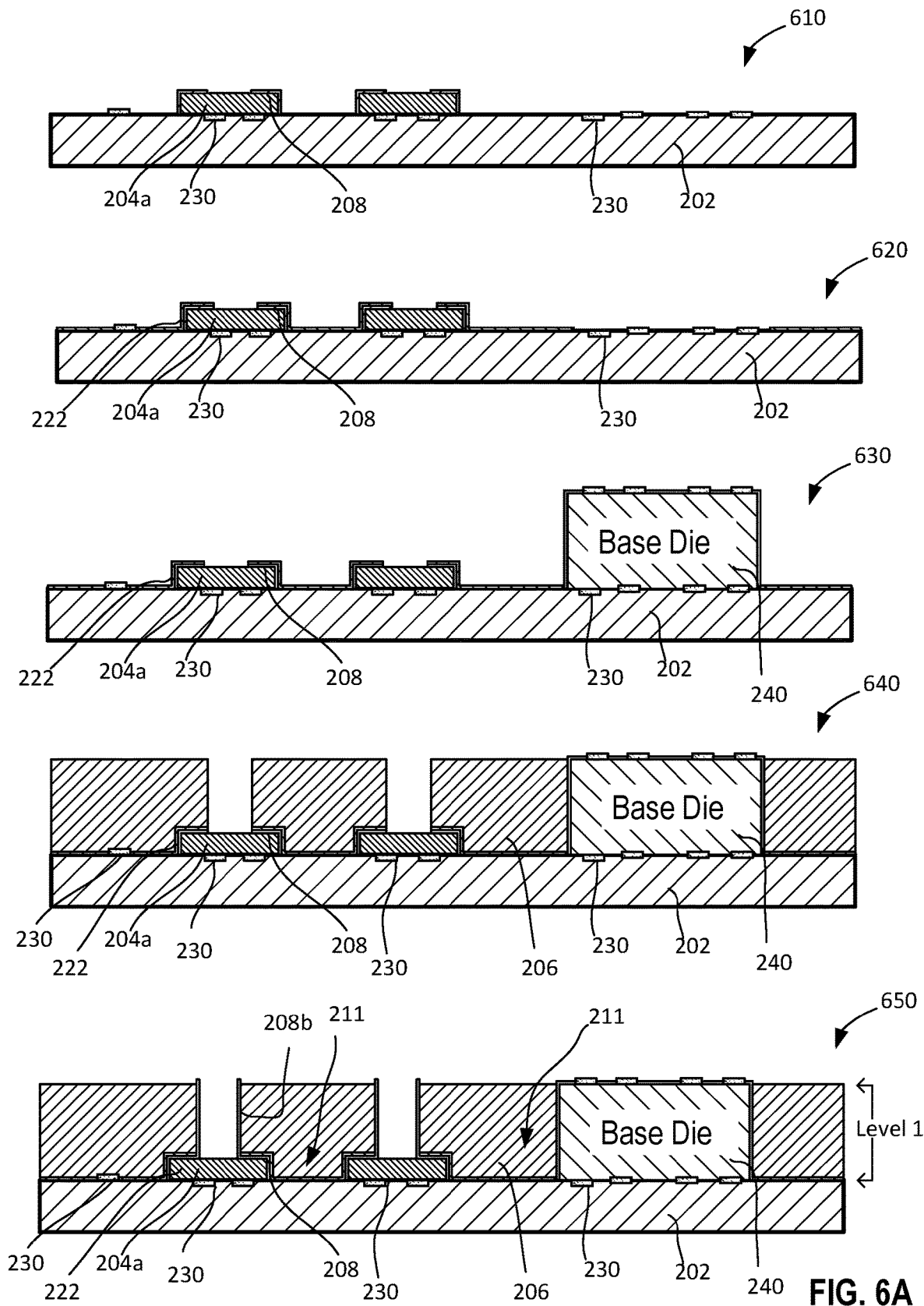
FIGS. 6A and 6B illustrate stages of a process according to some embodiments.
Figure 6B:
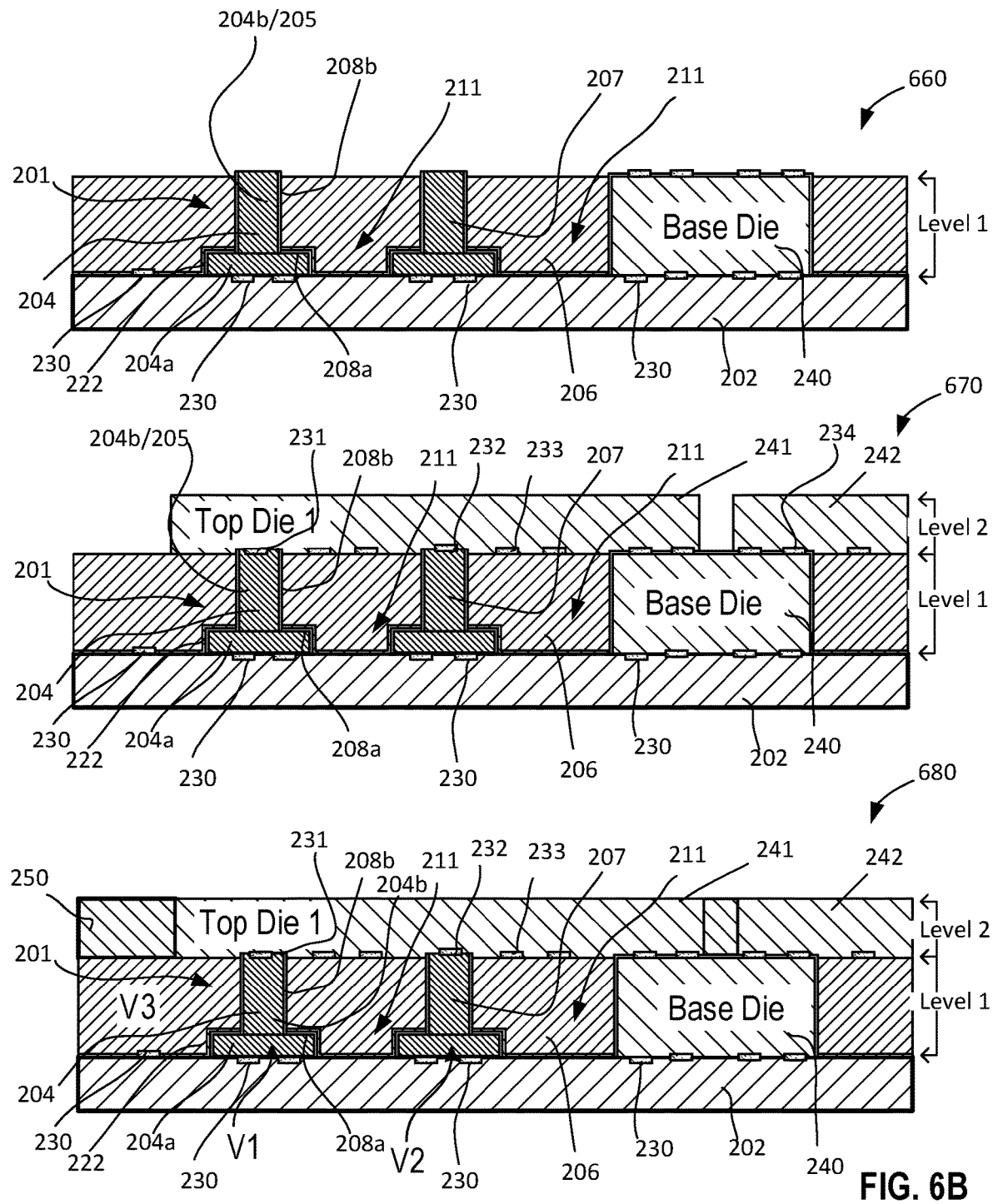

FIGS. 6A and 6B together illustrate an example process 600 for manufacturing a conformal power delivery structure similar to that of FIG. 2 in accordance with some embodiments, with the operations in FIG. 6B being the continuation of operations in FIG. 6A. Components in FIGS. 6A and 6B have been referred to in those figures with the very same reference numerals as those used to refer to corresponding components in FIG. 2.

The example process 600 is a simplified process and illustrates only certain steps that may be performed for manufacturing a conformal power delivery structure in accordance with the present disclosure. In some cases, the process 600 may include fewer, additional, or different operations/steps than those illustrated and described below.

At 610, a metal layer is deposited and patterned on a substrate 202 to yield interconnects 204a. The substrate may be a printed circuit board (PCB), wafer, package, etc., and the metal layer 204 may be any suitable conducting metal, such as, for example, copper, aluminum, titanium, etc. The metal layer may be deposited using electroplating or high-throughput additive manufacturing (HTAM). At 610, in addition, a dielectric layer may be deposited and patterned over the exposed portions of the substrate 202 and interconnects 204a to yield the dielectric layer 208, which will be useful to electrically insulate the interconnects 204a from the second power plane/HTAM layer 206 to be described later. The dielectric layer 208 may be formed using an organic dielectric material, such as, for example, silica filled epoxy or inorganic dielectric such as Si3N4, TiO2, HfO2, SiCN, SiO2, AlN, Al2O3 or other similar materials or combinations of different layers. The dielectric layer may be patterned for example using laser ablation to provide the dielectric layer 208 patterned as shown at operation 610.

At 620, a buffer layer may be deposited on exposed portions of the substrate and the dielectric layer 208, and patterned to yield buffer layer 222. The buffer layer may be deposited using any suitable technique, such as sputtering. A patterning of the buffer layer after its deposition may yield exposed portions of the interconnects 204a at top surfaces thereof to make room for vias 204b, and further exposed contacts 230 for allowing electrical coupling between substrate 202 and base die 240.

At 630, base die 240 may be electrically and mechanically coupled to the substrate, including by way of being coupled to contacts 230 in any known manner. The base die 240 may include a dielectric or otherwise electrically insulating casing.

At 640, a metal layer is deposited over the assembly shown in the context of operation 630, and patterned to provide the second power plane/HTAM layer 206 defining via holes therein leading to exposed top surfaces of interconnects 204a. The metal layer 206 forms the second power plane/HTAM layer of the conformal power delivery structure. The metal layer 206 may be deposited, for example using cold spray, through a mask or stencil to form the via holes. The deposited metal layer 206 may be a pure metal (e.g., copper, aluminum, etc.) or a composite (e.g., copper with diamond or silicon carbide fillers) e.g., for improved mechanical and/or thermal performance. After deposition of the metal layer 206, a top surface of the assembly may be planarized, for example through backgrinding if necessary.

At 650, an inner dielectric liner 208b may be provided on sidewalls of the via holes. Various deposition methods such as chemical vapor deposition (CVD), atomic layer CVD (ALCVD), physical vapor deposition (PVD), or spin-on may be used to deposit the dielectric liner 208b.

At 660, the via holes may be filled with a conductive material, for example, with an electrolytic plating process. such as an electrolytic copper plating process, to create vias 204b/205 and 207.

At 670, top dies 241 and 242 may be attached to sets of contacts 231, 232, 233 and 234. The dies may be attached in any manner as would be within the knowledge of a skilled person.

At 680, a molded layer may be deposited over the top dies 241 and 242 in a known manner, and planarized if necessary, for example using backgrinding, to expose the top dies.

Figure 7:
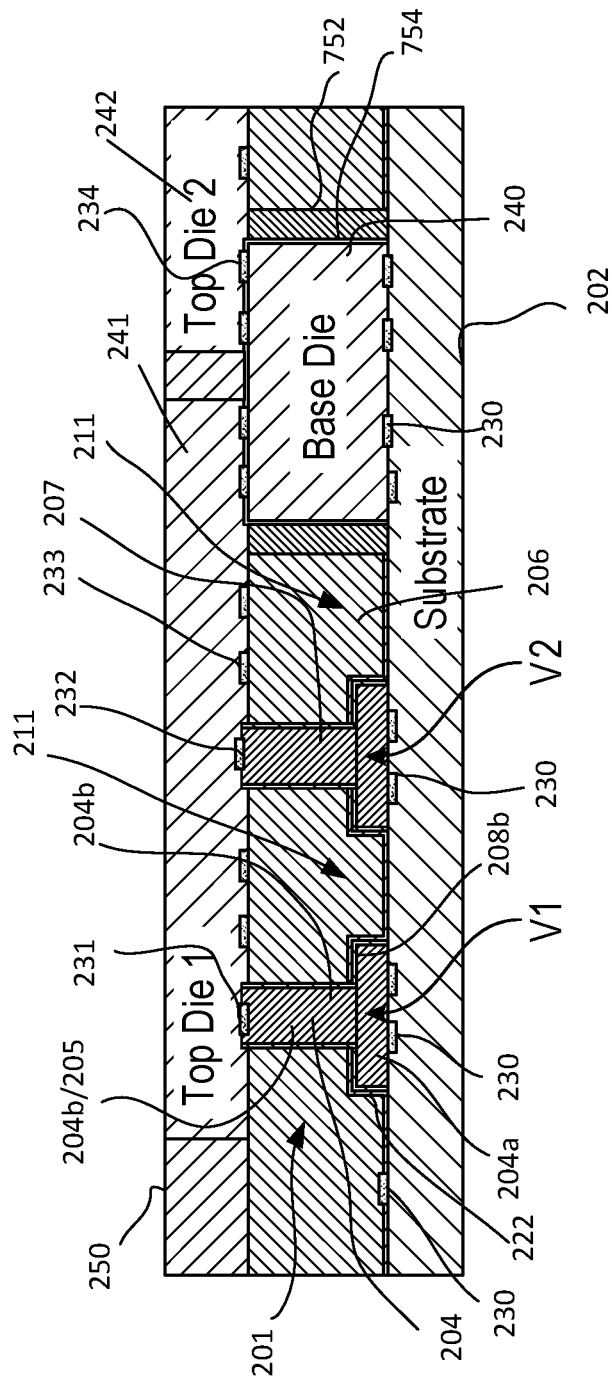
FIG. 7 illustrates an example system that includes a conformal power delivery structure in accordance with a modified version of the first embodiment of the present disclosure.

FIG. 7 shows a modification of the embodiment of FIG. 2 (and may further apply to a modification of any of the embodiments of FIG. 3 or 4, although not shown). Components in FIG. 7 have been referred to that figure with the very same reference numerals as those used to refer to corresponding components in FIG. 2. In FIG. 7, the base die 240 can be surrounded by an optional thermomechanical buffer layer 752 to mitigate coefficient of thermal expansion (CTE) mismatch between the base die 240 and the HTAM layer 206. This thermomechanical buffer layer 752 can be provided at operation 630 in FIG. 6A, and can be in addition to the pre-deposited dielectric 754 on the edges of the base die (noting that the same pre-deposited dielectric is assumed to have existed for the dies in FIGS. 2, 3 and 4 as well, although not explicitly described in those figures). The thermomechanical buffer layer 752 can protect a fragile base die 240 during thermal cycling, possibly at the expense of some loss of thermal performance. The thermomechanical buffer layer in FIG. 7 is shown to exhibit a rectangular cross-section, although embodiments are not so limited. For example, this thermomechanical buffer layer can be identical to an underfill fillet formed after attaching the base die to the substrate in operation 630 of FIG. 6A. The thermomechanical buffer layer can be made of a material having a Young's modulus less than about 10 gigapascals, such as an epoxy.

In certain embodiments, the techniques described above with respect to FIGS. 6A and 6B may be used to deposit additional metal layers to form fourth, fifth, sixth, or more power planes in a conformal power delivery structure. For instance, aspects of the process 1200 of FIG. 12 may be combined to produce a conformal power delivery structure that provides access to three (or more) power planes on both the top and bottom sides of the conformal power delivery structure.

Figure 8:
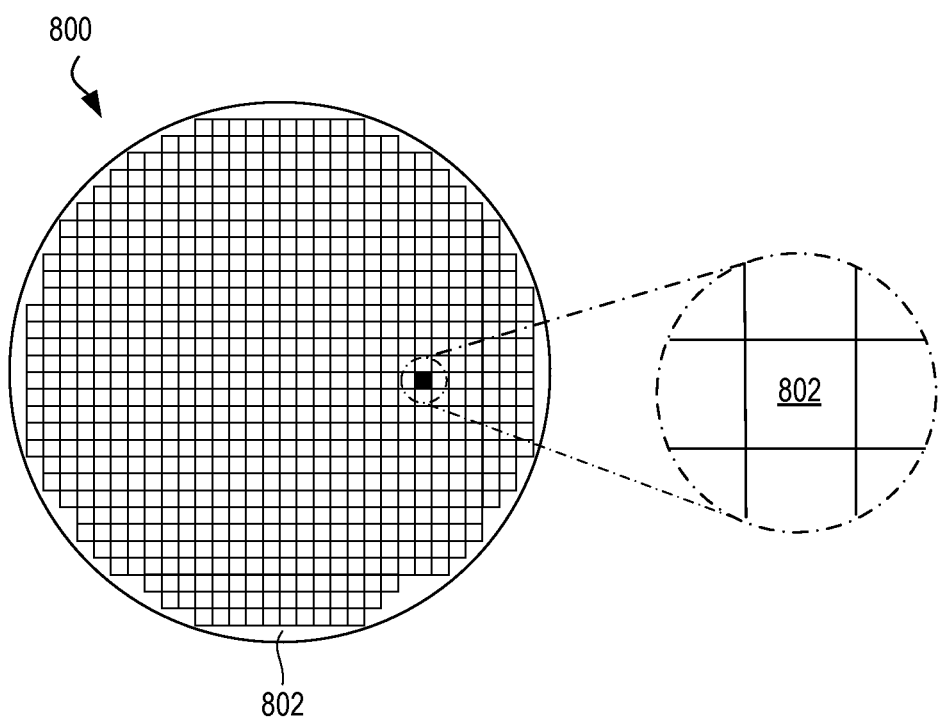
FIG. 8 is a top view of a wafer and dies that may be included in a microelectronic assembly, in accordance with any of the embodiments disclosed herein.

FIG. 8 is a top view of a wafer 800 and dies 802 in a package that may include any of the conformal power delivery structures disclosed herein. The wafer 800 may be composed of semiconductor material and may include one or more dies 802 having integrated circuit structures formed on a surface of the wafer 800. The individual dies 802 may be a repeating unit of an integrated circuit product that includes any suitable integrated circuit. After the fabrication of the semiconductor product is complete, the wafer 800 may undergo a singulation process in which the dies 802 are separated from one another to provide discrete "chips" of the integrated circuit product. The die 802 may include one or more transistors (e.g., some of the transistors 940 of FIG. 9, discussed below), supporting circuitry to route electrical signals to the transistors, passive components (e.g., signal traces, resistors, capacitors, or inductors), and/or any other integrated circuit components. In some embodiments, the wafer 800 or the die 802 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 802. For example, a memory array formed by multiple memory devices may be formed on a same die 802 as a processor unit (e.g., the processor unit 1102 of FIG. 11) or other logic that is configured to store information in the memory devices or execute instructions stored in the memory array. Various embodiments disclosed herein may be manufactured using a die-to-wafer assembly technique in which some dies are attached to a wafer 800 that include others of the dies, and the wafer 800 is subsequently singulated.

Figure 9:
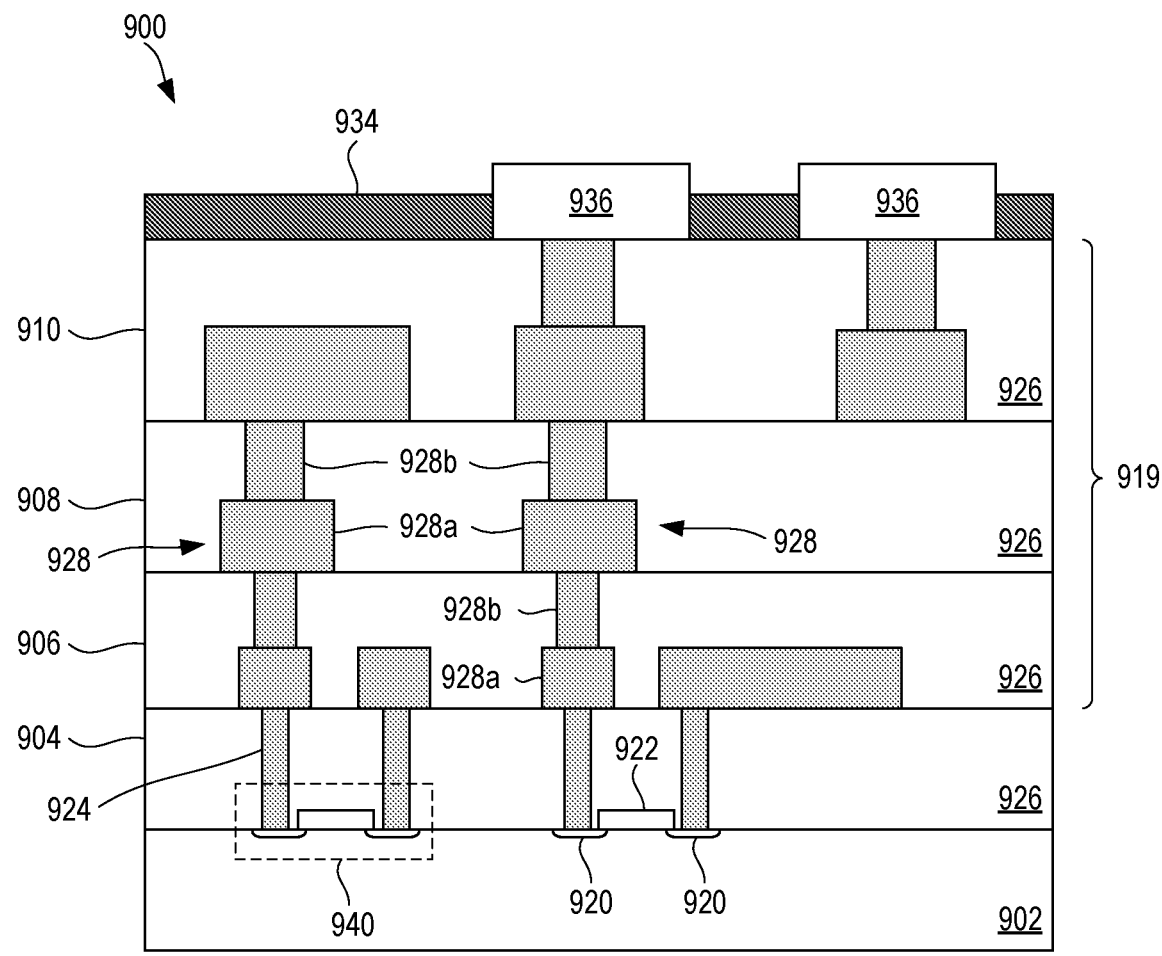
FIG. 9 is a cross-sectional side view of an integrated circuit device that may be included in a microelectronic assembly, in accordance with any of the embodiments disclosed herein.

FIG. 9 is a cross-sectional side view of an integrated circuit device 900 that may include or be made of a package that includes any of the conformal power delivery structures disclosed herein. One or more of the integrated circuit devices 900 may be included in one or more dies 802 (FIG. 8). The integrated circuit device 900 may be formed on a die substrate 902 (e.g., the wafer 800 of FIG. 8) and may be included in a die (e.g., the die 802 of FIG. 8). The die substrate 902 may be a semiconductor substrate composed of semiconductor material systems including, for example, n-type or p-type materials systems (or a combination of both). The die substrate 902 may include, for example, a crystalline substrate formed using a bulk silicon or a silicon-on-insulator (SOI) substructure. In some embodiments, the die substrate 902 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 902. Although a few examples of materials from which the die substrate 902 may be formed are described here, any material that may serve as a foundation for an integrated circuit device 900 may be used. The die substrate 902 may be part of a singulated die (e.g., the dies 802 of FIG. 8) or a wafer (e.g., the wafer 800 of FIG. 8).

The integrated circuit device 900 may include one or more device layers 904 disposed on the die substrate 902. The device layer 904 may include features of one or more transistors 940 (e.g., metal oxide semiconductor field-effect transistors (MOSFETs)) formed on the die substrate 902. The transistors 940 may include, for example, one or more source and/or drain (S/D) regions 920, a gate 922 to control current flow between the S/D regions 920, and one or more S/D contacts 924 to route electrical signals to/from the S/D regions 920. The transistors 940 may include additional features not depicted for the sake of clarity, such as device isolation regions, gate contacts, and the like. The transistors 940 are not limited to the type and configuration depicted in FIG. 9 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

A transistor 940 may include a gate 922 formed of at least two layers, a gate dielectric and a gate electrode. The gate dielectric may include one layer or a stack of layers. The one or more layers may include silicon oxide, silicon dioxide, silicon carbide, and/or a high-k dielectric material.

The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 940 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 940 along the source-channel-drain direction, the gate electrode may consist of a U-shaped structure that includes a bottom portion substantially parallel to the surface of the die substrate 902 and two sidewall portions that are substantially perpendicular to the top surface of the die substrate 902. In other embodiments, at least one of the metal layers that form the gate electrode may simply be a planar layer that is substantially parallel to the top surface of the die substrate 902 and does not include sidewall portions substantially perpendicular to the top surface of the die substrate 902. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 920 may be formed within the die substrate 902 adjacent to the gate 922 of individual transistors 940. The S/D regions 920 may be formed using an implantation/diffusion process or an etching/deposition process, for example. In the former process, dopants such as boron, aluminum, antimony, phosphorous, or arsenic may be ion-implanted into the die substrate 902 to form the S/D regions 920. An annealing process that activates the dopants and causes them to diffuse farther into the die substrate 902 may follow the ion-implantation process. In the latter process, the die substrate 902 may first be etched to form recesses at the locations of the S/D regions 920. An epitaxial deposition process may then be carried out to fill the recesses with material that is used to fabricate the S/D regions 920. In some implementations, the S/D regions 920 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 920 may be formed using one or more alternate semiconductor materials such as germanium or a group III-V material or alloy. In further embodiments, one or more layers of metal and/or metal alloys may be used to form the S/D regions 920.

Electrical signals, such as power and/or input/output (I/O) signals, may be routed to and/or from the devices (e.g., transistors 940) of the device layer 904 through one or more interconnect layers disposed on the device layer 904 (illustrated in FIG. 9 as interconnect layers 906-910). For example, electrically conductive features of the device layer 904 (e.g., the gate 922 and the S/D contacts 924) may be electrically coupled with the interconnect structures 928 of the interconnect layers 906-910. The one or more interconnect layers 906-910 may form a metallization stack (also referred to as an "ILD stack") 919 of the integrated circuit device 900.

The interconnect structures 928 may be arranged within the interconnect layers 906-910 to route electrical signals according to a wide variety of designs; in particular, the arrangement is not limited to the particular configuration of interconnect structures 928 depicted in FIG. 9. Although a particular number of interconnect layers 906-910 is depicted in FIG. 9, embodiments of the present disclosure include integrated circuit devices having more or fewer interconnect layers than depicted.

In some embodiments, the interconnect structures 928 may include lines 928a and/or vias 928b filled with an electrically conductive material such as a metal. The lines 928a may be arranged to route electrical signals in a direction of a plane that is substantially parallel with a surface of the die substrate 902 upon which the device layer 904 is formed. For example, the lines 928a may route electrical signals in a direction in and out of the page and/or in a direction across the page from the perspective of FIG. 13. The vias 928b may be arranged to route electrical signals in a direction of a plane that is substantially perpendicular to the surface of the die substrate 902 upon which the device layer 904 is formed. In some embodiments, the vias 928b may electrically couple lines 928a of different interconnect layers 906-910 together.

The interconnect layers 906-910 may include a dielectric material 926 disposed between the interconnect structures 928, as shown in FIG. 9. In some embodiments, dielectric material 926 disposed between the interconnect structures 928 in different ones of the interconnect layers 906-910 may have different compositions; in other embodiments, the composition of the dielectric material 926 between different interconnect layers 906-910 may be the same. The device layer 904 may include a dielectric material 926 disposed between the transistors 940 and a bottom layer of the metallization stack as well. The dielectric material 926 included in the device layer 904 may have a different composition than the dielectric material 926 included in the interconnect layers 906-910; in other embodiments, the composition of the dielectric material 926 in the device layer 904 may be the same as a dielectric material 926 included in any one of the interconnect layers 906-910.

A first interconnect layer 906 (referred to as Metal 1 or "M1") may be formed directly on the device layer 904. In some embodiments, the first interconnect layer 906 may include lines 928a and/or vias 928b, as shown. The lines 928a of the first interconnect layer 906 may be coupled with contacts (e.g., the S/D contacts 924) of the device layer 904. The vias 928b of the first interconnect layer 906 may be coupled with the lines 928a of a second interconnect layer 908.

The second interconnect layer 908 (referred to as Metal 2 or "M2") may be formed directly on the first interconnect layer 906. In some embodiments, the second interconnect layer 908 may include via 928b to couple the lines 928 of the second interconnect layer 908 with the lines 928a of a third interconnect layer 910. Although the lines 928a and the vias 928b are structurally delineated with a line within individual interconnect layers for the sake of clarity, the lines 928a and the vias 928b may be structurally and/or materially contiguous (e.g., simultaneously filled during a dual-damascene process) in some embodiments.

The third interconnect layer 910 (referred to as Metal 3 or "M3") (and additional interconnect layers, as desired) may be formed in succession on the second interconnect layer 908 according to similar techniques and configurations described in connection with the second interconnect layer 908 or the first interconnect layer 906. In some embodiments, the interconnect layers that are "higher up" in the metallization stack 919 in the integrated circuit device 900 (i.e., farther away from the device layer 904) may be thicker that the interconnect layers that are lower in the metallization stack 919, with lines 928a and vias 928b in the higher interconnect layers being thicker than those in the lower interconnect layers.

The integrated circuit device 900 may include a solder resist material 934 (e.g., polyimide or similar material) and one or more conductive contacts 936 formed on the interconnect layers 906-910. In FIG. 9, the conductive contacts 936 are illustrated as taking the form of bond pads. The conductive contacts 936 may be electrically coupled with the interconnect structures 928 and configured to route the electrical signals of the transistor(s) 940 to external devices. For example, solder bonds may be formed on the one or more conductive contacts 936 to mechanically and/or electrically couple an integrated circuit die including the integrated circuit device 900 with another component (e.g., a printed circuit board). The integrated circuit device 900 may include additional or alternate structures to route the electrical signals from the interconnect layers 906-910; for example, the conductive contacts 936 may include other analogous features (e.g., posts) that route the electrical signals to external components.

In some embodiments in which the integrated circuit device 900 is a double-sided die, the integrated circuit device 900 may include another metallization stack (not shown) on the opposite side of the device layer(s) 904. This metallization stack may include multiple interconnect layers as discussed above with reference to the interconnect layers 906-910, to provide conductive pathways (e.g., including conductive lines and vias) between the device layer(s) 904 and additional conductive contacts (not shown) on the opposite side of the integrated circuit device 900 from the conductive contacts 936.

In other embodiments in which the integrated circuit device 900 is a double-sided die, the integrated circuit device 900 may include one or more through silicon vias (TSVs) through the die substrate 902; these TSVs may make contact with the device layer(s) 904, and may provide conductive pathways between the device layer(s) 904 and additional conductive contacts (not shown) on the opposite side of the integrated circuit device 900 from the conductive contacts 936. In some embodiments, TSVs extending through the substrate can be used for routing power and ground signals from conductive contacts on the opposite side of the integrated circuit device 900 from the conductive contacts 936 to the transistors 940 and any other components integrated into the die 900, and the metallization stack 919 can be used to route I/O signals from the conductive contacts 936 to transistors 940 and any other components integrated into the die 900.

Multiple integrated circuit devices 900 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 10:
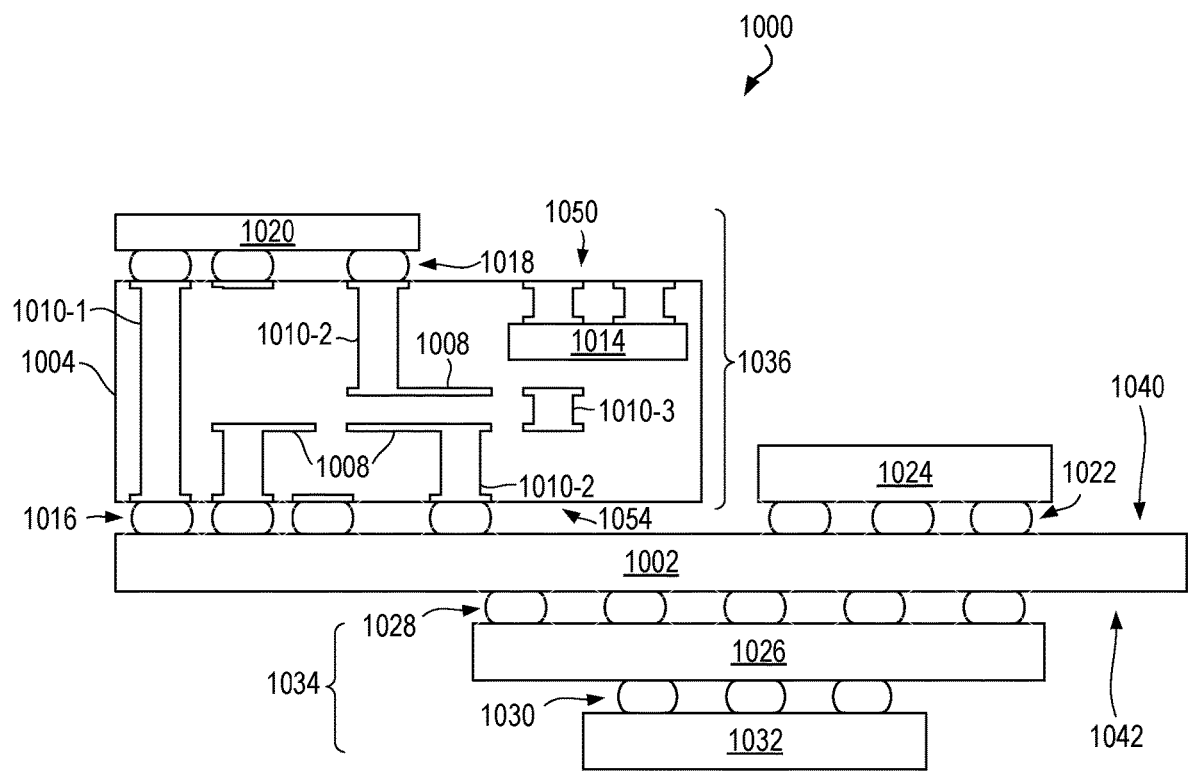
FIG. 10 is a cross-sectional side view of an integrated circuit device assembly that may include a microelectronic assembly, in accordance with any of the embodiments disclosed herein.

FIG. 10 is a cross-sectional side view of an integrated circuit device assembly 1000 that may include any of the conformal power delivery structures disclosed herein. In some embodiments, the integrated circuit device assembly 1000 may be a microelectronic assembly. The integrated circuit device assembly 1000 includes a number of components disposed on a circuit board 1002 (which may be a motherboard, system board, mainboard, etc.). The integrated circuit device assembly 1000 includes components disposed on a first face 1040 of the circuit board 1002 and an opposing second face 1042 of the circuit board 1002; generally, components may be disposed on one or both faces 1040 and 1042.

In some embodiments, the circuit board 1002 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 1002. In other embodiments, the circuit board 1002 may be a non-PCB substrate. The integrated circuit device assembly 1000 illustrated in FIG. 10 includes a package-on-interposer structure 1036 coupled to the first face 1040 of the circuit board 1002 by coupling components 1016. The coupling components 1016 may electrically and mechanically couple the package-on-interposer structure 1036 to the circuit board 1002, and may include solder balls (as shown in FIG. 10), pins (e.g., as part of a pin grid array (PGA), contacts (e.g., as part of a land grid array (LGA)), male and female portions of a socket, an adhesive, an underfill material, and/or any other suitable electrical and/or mechanical coupling structure.

The package-on-interposer structure 1036 may include an integrated circuit component 1020 coupled to an interposer 1004 by coupling components 1018. The coupling components 1018 may take any suitable form for the application, such as the forms discussed above with reference to the coupling components 1016. Although a single integrated circuit component 1020 is shown in FIG. 10, multiple integrated circuit components may be coupled to the interposer 1004; indeed, additional interposers may be coupled to the interposer 1004. The interposer 1004 may provide an intervening substrate used to bridge the circuit board 1002 and the integrated circuit component 1020.

The integrated circuit component 1020 may be a packaged or unpacked integrated circuit product that includes one or more integrated circuit dies (e.g., the die 802 of FIG. 8, the integrated circuit device 900 of FIG. 9) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 1020, a single monolithic integrated circuit die comprises solder bumps attached to contacts on the die. The solder bumps allow the die to be directly attached to the interposer 1004. The integrated circuit component 1020 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 1020 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 1020 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 1020 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 1004 may spread connections to a wider pitch or reroute a connection to a different connection. For example, the interposer 1004 may couple the integrated circuit component 1020 to a set of ball grid array (BGA) conductive contacts of the coupling components 1016 for coupling to the circuit board 1002. In the embodiment illustrated in FIG. 10, the integrated circuit component 1020 and the circuit board 1002 are attached to opposing sides of the interposer 1004; in other embodiments, the integrated circuit component 1020 and the circuit board 1002 may be attached to a same side of the interposer 1004. In some embodiments, three or more components can be interconnected by way of the interposer 1004.

In some embodiments, the interposer 1004 may be formed as a PCB, including multiple metal layers separated from one another by layers of dielectric material and interconnected by electrically conductive vias. In some embodiments, the interposer 1004 may be formed of an epoxy resin, a fiberglass-reinforced epoxy resin, an epoxy resin with inorganic fillers, a ceramic material, or a polymer material such as polyimide. In some embodiments, the interposer 1004 may be formed of alternate rigid or flexible materials that may include the same materials described above for use in a semiconductor substrate, such as silicon, germanium, and other group III-V and group IV materials. The interposer 1004 may include metal interconnects 1008 and vias 1010, including but not limited to through hole vias 1010-1 (that extend from a first face 1050 of the interposer 1004 to a second face 1054 of the interposer 1004), blind vias 1010-2 (that extend from the first or second faces 1050 or 1054 of the interposer 1004 to an internal metal layer), and buried vias 1010-3 (that connect internal metal layers).

In some embodiments, the interposer 1004 can comprise a silicon interposer. Through silicon vias (TSV) extending through the silicon interposer can connect connections on a first face of a silicon interposer to an opposing second face of the silicon interposer. In some embodiments, an interposer 1004 comprising a silicon interposer can further comprise one or more routing layers to route connections on a first face of the interposer 1004 to an opposing second face of the interposer 1004.

The interposer 1004 may further include embedded devices 1014, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1004. The package-on-interposer structure 1036 may take the form of any of the package-on-interposer structures known in the art. In embodiments where the interposer is a non-printed circuit board The integrated circuit device assembly 1000 may include an integrated circuit component 1024 coupled to the first face 1040 of the circuit board 1002 by coupling components 1022. The coupling components 1022 may take the form of any of the embodiments discussed above with reference to the coupling components 1016, and the integrated circuit component 1024 may take the form of any of the embodiments discussed above with reference to the integrated circuit component 1020.

The integrated circuit device assembly 1000 illustrated in FIG. 10 includes a package-on-package structure 1034 coupled to the second face 1042 of the circuit board 1002 by coupling components 1028. The package-on-package structure 1034 may include an integrated circuit component 1026 and an integrated circuit component 1032 coupled together by coupling components 1030 such that the integrated circuit component 1026 is disposed between the circuit board 1002 and the integrated circuit component 1032. The coupling components 1028 and 1030 may take the form of any of the embodiments of the coupling components 1016 discussed above, and the integrated circuit components 1026 and 1032 may take the form of any of the embodiments of the integrated circuit component 1020 discussed above. The package-on-package structure 1034 may be configured in accordance with any of the package-on-package structures known in the art.

Figure 11:
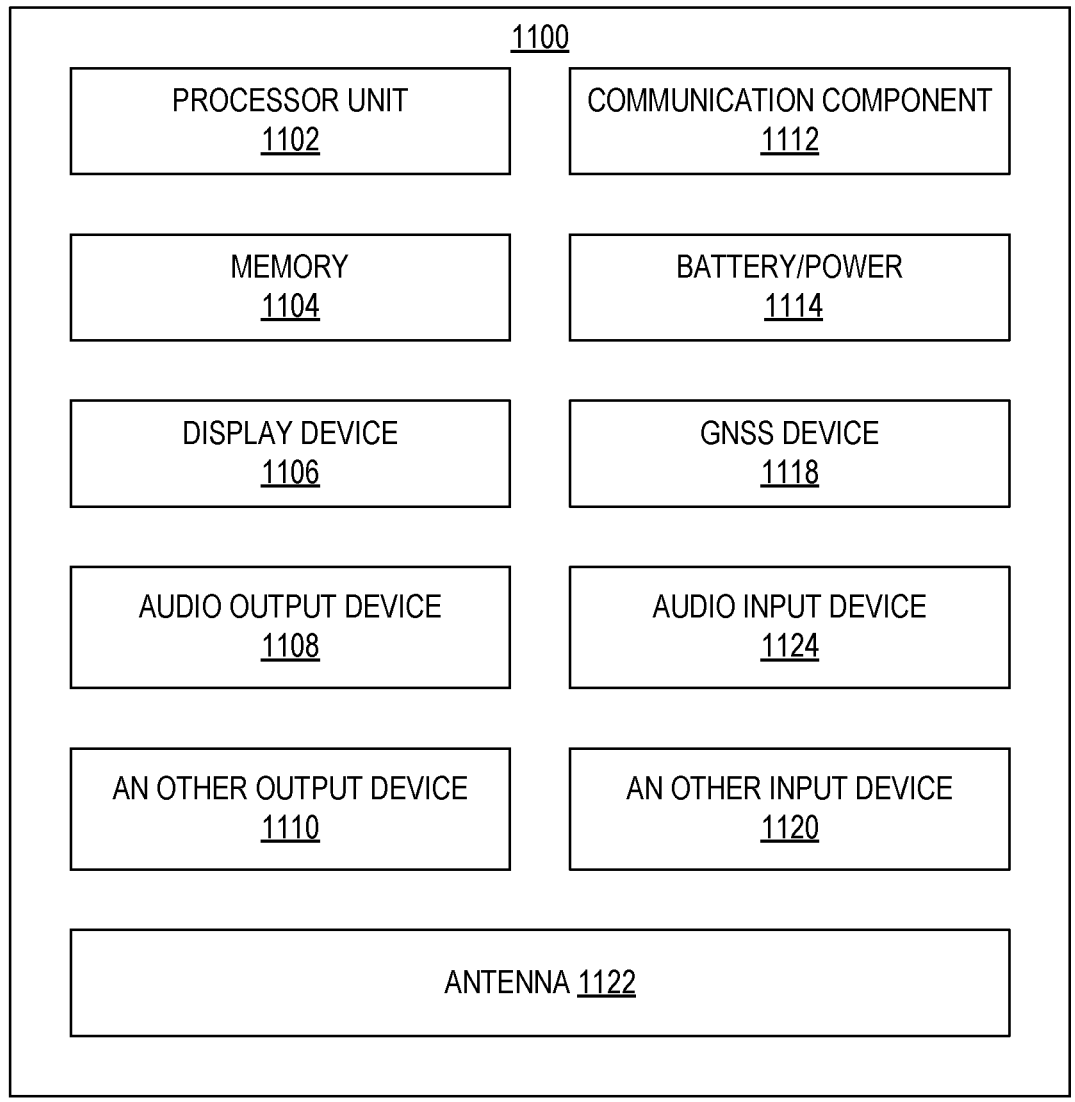
FIG. 11 is a block diagram of an example system or electrical device that may include a microelectronic assembly, in accordance with any of the embodiments disclosed herein.

FIG. 11 is a block diagram of an example electrical device 1100 that may include one or more of the conformal power delivery structures disclosed herein. For example, any suitable ones of the components of the electrical device 1100 may include one or more of the integrated circuit device assemblies 1000, integrated circuit components 1020, integrated circuit devices 900, or integrated circuit dies 802 disclosed herein. A number of components are illustrated in FIG. 11 as included in the electrical device 1100, but any one or more of these components may be omitted or duplicated, as suitable for the application. In some embodiments, some or all of the components included in the electrical device 1100 may be attached to one or more motherboards mainboards, or system boards. In some embodiments, one or more of these components are fabricated onto a single system-on-a-chip (SoC) die.

Additionally, in various embodiments, the electrical device 1100 may not include one or more of the components illustrated in FIG. 11, but the electrical device 1100 may include interface circuitry for coupling to the one or more components. For example, the electrical device 1100 may not include a display device 1106, but may include display device interface circuitry (e.g., a connector and driver circuitry) to which a display device 1106 may be coupled. In another set of examples, the electrical device 1100 may not include an audio input device 1124 or an audio output device 1108, but may include audio input or output device interface circuitry (e.g., connectors and supporting circuitry) to which an audio input device 1124 or audio output device 1108 may be coupled.

The electrical device 1100 may include one or more processor units 1102 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 1102 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 1100 may include a memory 1104, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 1104 may include memory that is located on the same integrated circuit die as the processor unit 1102. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 1100 can comprise one or more processor units 1102 that are heterogeneous or asymmetric to another processor unit 1102 in the electrical device 1100. There can be a variety of differences between the processing units 1102 in a system in terms of a spectrum of metrics of merit including architectural, microarchitectural, thermal, power consumption characteristics, and the like. These differences can effectively manifest themselves as asymmetry and heterogeneity among the processor units 1102 in the electrical device 1100.

In some embodiments, the electrical device 1100 may include a communication component 1112 (e.g., one or more communication components). For example, the communication component 1112 can manage wireless communications for the transfer of data to and from the electrical device 1100. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 1112 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 1112 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1112 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1112 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 1112 may operate in accordance with other wireless protocols in other embodiments. The electrical device 1100 may include an antenna 1122 to facilitate wireless communications and/or to receive other wireless communications (such as AM or FM radio transmissions).

In some embodiments, the communication component 1112 may manage wired communications, such as electrical, optical, or any other suitable communication protocols (e.g., IEEE 802.3 Ethernet standards). As noted above, the communication component 1112 may include multiple communication components. For instance, a first communication component 1112 may be dedicated to shorter-range wireless communications such as Wi-Fi or Bluetooth, and a second communication component 1112 may be dedicated to longer-range wireless communications such as global positioning system (GPS), EDGE, GPRS, CDMA, WiMAX, LTE, EV-DO, or others. In some embodiments, a first communication component 1112 may be dedicated to wireless communications, and a second communication component 1112 may be dedicated to wired communications.

The electrical device 1100 may include battery/power circuitry 1114. The battery/power circuitry 1114 may include one or more energy storage devices (e.g., batteries or capacitors) and/or circuitry for coupling components of the electrical device 1100 to an energy source separate from the electrical device 1100 (e.g., AC line power).

The electrical device 1100 may include a display device 1106 (or corresponding interface circuitry, as discussed above). The display device 1106 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 1100 may include an audio output device 1108 (or corresponding interface circuitry, as discussed above). The audio output device 1108 may include any embedded or wired or wirelessly connected external device that generates an audible indicator, such speakers, headsets, or earbuds.

The electrical device 1100 may include an audio input device 1124 (or corresponding interface circuitry, as discussed above). The audio input device 1124 may include any embedded or wired or wirelessly connected device that generates a signal representative of a sound, such as microphones, microphone arrays, or digital instruments (e.g., instruments having a musical instrument digital interface (MIDI) output). The electrical device 1100 may include a Global Navigation Satellite System (GNSS) device 1118 (or corresponding interface circuitry, as discussed above), such as a Global Positioning System (GPS) device. The GNSS device 1118 may be in communication with a satellite-based system and may determine a geolocation of the electrical device 1100 based on information received from one or more GNSS satellites, as known in the art.

The electrical device 1100 may include another output device 1110 (or corresponding interface circuitry, as discussed above). Examples of the other output device 1110 may include an audio codec, a video codec, a printer, a wired or wireless transmitter for providing information to other devices, or an additional storage device.

The electrical device 1100 may include another input device 1120 (or corresponding interface circuitry, as discussed above). Examples of the other input device 1120 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 1100 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra-mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 1100 may be any other electronic device that processes data. In some embodiments, the electrical device 1100 may comprise multiple discrete physical components. Given the range of devices that the electrical device 1100 can be manifested as in various embodiments, in some embodiments, the electrical device 1100 can be referred to as a computing device or a computing system.

Figure 12:
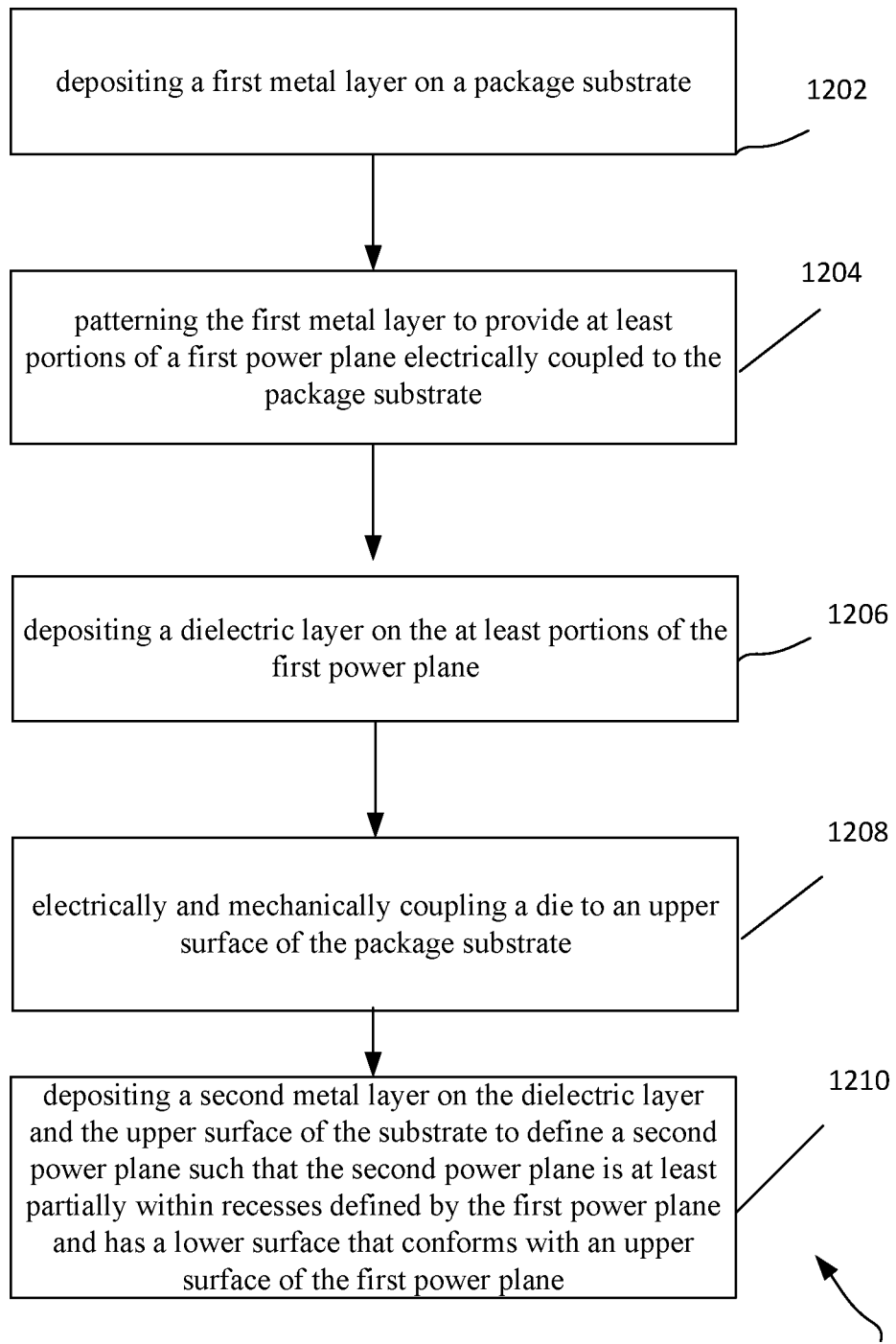
FIG. 12 illustrates an example process according to some embodiments.

FIG. 12 shows a process 1200 according to some embodiments. At operation 1202, the process includes depositing a first metal layer on a package substrate; at operation 1204, the process includes patterning the first metal layer to provide at least portions of a first power plane electrically coupled to the package substrate; at operation 1206, the process includes depositing a dielectric layer on the at least portions of the first power plane; at operation 1208, the process includes electrically and mechanically coupling a die to an upper surface of the package substrate; and at operation 1210, the process includes depositing a second metal layer on the dielectric layer and the upper surface of the substrate to define a second power plane such that the second power plane is at least partially within recesses defined by the first power plane and has a lower surface that conforms with an upper surface of the first power plane.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of embodiments has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

In embodiments, the phrase "A is located on B" means that at least a part of A is in direct physical contact or indirect physical contact (having one or more other features between A and B) with at least a part of B.

In the instant description, "A is adjacent to B" means that at least part of A is in direct physical contact with at least a part of B.

In the instant description, "B is between A and C" means that at least part of B is in or along a space separating A and C and that the at least part of B is in direct or indirect physical contact with A and C.

In the instant description, "A is attached to B" means that at least part of A is mechanically attached to at least part of B, either directly or indirectly (having one or more other features between A and B).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," "according to some embodiments," "in accordance with embodiments," or "in embodiments," which may each refer to one or more of the same or different embodiments. Furthermore, the terms "comprising," "including," "having," and the like, as used with respect to embodiments of the present disclosure, are synonymous.

"Coupled" as used herein means that two or more elements are in direct physical contact, or that that two or more elements indirectly physically contact each other, but yet still cooperate or interact with each other (i.e. one or more other elements are coupled or connected between the elements that are said to be coupled with each other). The term "directly coupled" means that two or more elements are in direct contact.

As used herein, the term "module" refers to being part of, or including an ASIC, an electronic circuit, a system on a chip, a processor (shared, dedicated, or group), a solid state device, a memory (shared, dedicated, or group) that execute one or more software or firmware programs, a combinational logic circuit, and/or other suitable components that provide the described functionality.

As used herein, "electrically conductive" in some examples may refer to a property of a material having an electrical conductivity greater than or equal to $10^7$ Siemens per meter (S/m) at 20 degrees Celsius. Examples of such materials include Cu, Ag, Al, Au, W, Zn and Ni.

As used herein, an "integrated circuit structure" may include one or more microelectronic dies.

In the corresponding drawings of the embodiments, signals, currents, electrical biases, or magnetic or electrical polarities may be represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, polarity, current, voltage, etc, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the elements that are connected, without any intermediary devices. The term "coupled" means a direct or indirect connection, such as a direct electrical, mechanical, or magnetic connection between the elements that are connected or an indirect connection, through one or more passive or active intermediary devices. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

EXAMPLES

Some examples of embodiments are provided below.

Example 1 includes a conformal power delivery structure comprising: a package substrate; a die adjacent to and electrically coupled to an upper surface of the package substrate; a first power plane adjacent the upper surface of the package substrate and electrically coupled thereto, the first power plane further comprising metal and defining one or more recesses therein; a second power plane comprising metal, the second power plane at least partially within the recesses of the first power plane and having a lower surface that conforms with the upper surface of the first power plane; and a dielectric material between the first power plane and the second power plane.

Example 2 includes the subject matter of Example 1, wherein the first power plane corresponds to one or more first electrical pathways to the package substrate, and the second power plane corresponds to one or more second electrical pathways to the package substrate.

Example 3 includes the subject matter of Example 2, wherein the first power plane includes one or more interconnects electrically coupled to the upper surface of the package substrate, and one or more vias extending from at least some of the one or more interconnects away from the upper surface of the package substrate.

Example 4 includes the subject matter of Example 1, wherein the first and second power planes are co-planar with one another in areas defined by the recesses.

Example 5 includes the subject matter of Example 1, wherein the second power plane has a granular microstructure including randomly distributed particles presenting substantially non-linear particle-to-particle boundaries with one another.

Example 6 includes the subject matter of Example 5, wherein the particles have sizes ranging from about 10 microns to about 100 microns.

Example 7 includes the subject matter of Example 5, wherein the granular microstructure has a maximum porosity of about 5%.

Example 8 includes the subject matter of Example 5, further including a buffer layer between the second power plane and at least one of the package substrate and the first power plane, wherein an interface between the buffer layer and second power plane has a non-flat configuration as compared with an interface between the first power plane and the package substrate, wherein some particles of the second power plane are at least in part embedded within indentations of the buffer layer.

Example 9 includes the subject matter of Example 8, wherein the buffer layer includes at least one of indium, silver, gold, tin, lead, titanium, nickel, vanadium, or alloys thereof.

Example 10 includes the subject matter of Example 1, further including a thermomechanical buffer material between the die and the second power plane, the buffer material having a Young's modulus less than about 10 gigapascals.

Example 11 includes the subject matter of Example 10, wherein the buffer material includes epoxy.

Example 12 includes a three-dimensional stacked die assembly including: a package substrate; a stack of material levels disposed above one another on the package substrate, the levels including a first level adjacent an upper surface of the substrate, and a second level adjacent an upper surface of the first level, wherein: the first level includes: a base die adjacent to and electrically coupled to an upper surface of the package substrate; a first power plane adjacent the upper surface of the package substrate and electrically coupled thereto, the first power plane further comprising metal and defining one or more recesses therein; a second power plane comprising metal, the second power plane at least partially within the recesses of the first power plane and having a lower surface that conforms with the upper surface of the first power plane; and a dielectric material between the first power plane and the second power plane; and the second level includes one or more top dies electrically coupled to the package substrate.

Example 13 includes the subject matter of Example 12, wherein the one or more top dies are embedded in a molded compound.

Example 14 includes the subject matter of Example 12, wherein the second power plane extends to the second level such that the one or more top dies are embedded in the second power plane.

Example 15 includes the subject matter of Example 14, further including: a first buffer layer between the second power plane and at least one of the package substrate and the first power plane; and a second buffer layer between the second power plane and upper surfaces of the one or more top dies, wherein: an interface between the first buffer layer and the second power plane, and an interface between the second buffer layer and the second power plane both have a non-flat configuration as compared with an interface between the first power plane and the package substrate, wherein some particles of the second power plane are at least in part embedded within indentations of the first buffer layer and the second buffer layer.

Example 16 includes the subject matter of Example 12, wherein the one or more top dies include a single die extending through an entirety of the second level.

Example 17 includes a system including: one or more processing units; a memory coupled to the one or more processing units; and a three-dimensional stacked die assembly coupled to the one or more processing units and the memory and including: a package substrate; a stack of material levels disposed above one another on the package substrate, the levels including a first level adjacent an upper surface of the substrate, and a second level adjacent an upper surface of the first level, wherein: the first level includes: a base die adjacent to and electrically coupled to an upper surface of the package substrate; a first power plane adjacent the upper surface of the package substrate and electrically coupled thereto, the first power plane further comprising metal and defining one or more recesses therein; a second power plane comprising metal, the second power plane at least partially within the recesses of the first power plane and having a lower surface that conforms with the upper surface of the first power plane; and a dielectric material between the first power plane and the second power plane; and the second level includes one or more top dies electrically coupled to the package substrate.

Example 18 includes the subject matter of Example 17, wherein the one or more top dies are embedded in a molded compound.

Example 19 includes the subject matter of Example 17, wherein the second power plane extends to the second level such that the one or more top dies are embedded in the second power plane.

Example 20 includes the subject matter of Example 17, wherein the one or more top dies include a single die extending through an entirety of the second level.

Example 21 includes a method of manufacturing a conformal power delivery structure, the method comprising: depositing a first metal layer on a package substrate; patterning the first metal layer to provide at least portions of a first power plane electrically coupled to the package substrate; depositing a dielectric layer on the at least portions of the first power plane; electrically and mechanically coupling a die to an upper surface of the package substrate; and depositing a second metal layer on the dielectric layer and the upper surface of the substrate to define a second power plane such that the second power plane is at least partially within recesses defined by the first power plane and has a lower surface that conforms with an upper surface of the first power plane.

Example 22 includes the subject matter of Example 21, wherein the second metal layer is deposited via a cold spray process.

Example 23 includes the subject matter of Example 22, wherein both the first metal layer and the second metal layer are deposited via a cold spray process.

Example 24 includes the subject matter of Example 21, wherein: the at least portions of a first power plane include interconnects; depositing a dielectric layer on the at least portions of the first power plane includes depositing the dielectric layer on the interconnects; and the method further includes: patterning the dielectric layer to define openings therein at upper surfaces of the interconnects; patterning the second metal layer to define via holes therein in registration with the openings at the upper surfaces of the interconnects; and filling the via holes with an electrically conductive material to define vias, the first power plane including the interconnects and the vias.

Example 25 includes the subject matter of Example 21, further including providing an epoxy between the base die and the second power plane Example 26 includes a product made by the process of any one of the methods of Examples 21-25.

In the foregoing, a detailed description has been given with reference to specific example embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment(s) and other exemplarily language does not necessarily refer to the same embodiment or the same example, but may refer to different and distinct embodiments, as well as potentially the same embodiment.

The invention claimed is:
1. A conformal power delivery structure comprising:
   a package substrate;
   a die adjacent to and electrically coupled to an upper surface of the package substrate;

a first power plane adjacent the upper surface of the package substrate and electrically coupled thereto, the first power plane further comprising metal and defining one or more recesses therein;
a second power plane comprising metal, the second power plane at least partially within the one or more recesses of the first power plane and having a lower surface that conforms with an upper surface of the first power plane; and
a dielectric material between the first power plane and the second power plane.

2. The conformal power delivery structure of claim 1, wherein the first power plane corresponds to one or more first electrical pathways to the package substrate, and the second power plane corresponds to one or more second electrical pathways to the package substrate.

3. The conformal power delivery structure of claim 2, wherein the first power plane includes one or more interconnects electrically coupled to the upper surface of the package substrate, and one or more vias extending from at least some of the one or more interconnects away from the upper surface of the package substrate.

4. The conformal power delivery structure of claim 1, wherein the first power plane and the second power plane are co-planar with one another in areas defined by the one or more recesses.

5. The conformal power delivery structure of claim 1, wherein the second power plane has a granular microstructure including randomly distributed particles presenting substantially non-linear particle-to-particle boundaries with one another.

6. The conformal power delivery structure of claim 5, wherein the randomly distributed particles have sizes ranging from about 10 microns to about 100 microns.

7. The conformal power delivery structure of claim 5, wherein the granular microstructure has a maximum porosity of about 5%.

8. The conformal power delivery structure of claim 5, further including a buffer layer between the second power plane and at least one of the package substrate and the first power plane, wherein an interface between the buffer layer and second power plane has a non-flat configuration as compared with an interface between the first power plane and the package substrate, wherein some particles of the randomly distributed particles of the second power plane are at least in part embedded within indentations of the buffer layer.

9. The conformal power delivery structure of claim 8, wherein the buffer layer includes at least one of indium, silver, gold, tin, lead, titanium, nickel, vanadium, or alloys thereof.

10. The conformal power delivery structure of claim 1, further including a thermomechanical buffer material between the die and the second power plane, the thermomechanical buffer material having a Young's modulus less than about 10 gigapascals.

11. The conformal power delivery structure of claim 10, wherein the thermomechanical buffer material includes epoxy.

12. A three-dimensional stacked die assembly including:
a package substrate;
a stack of material levels disposed above one another on the package substrate, the stack of material levels including a first level adjacent an upper surface of the package substrate, and a second level adjacent an upper surface of the first level, wherein:
the first level includes:
a base die adjacent to and electrically coupled to an upper surface of the package substrate;
a first power plane adjacent the upper surface of the package substrate and electrically coupled thereto, the first power plane further comprising metal and defining one or more recesses therein;
a second power plane comprising metal, the second power plane at least partially within the one or more recesses of the first power plane and having a lower surface that conforms with an upper surface of the first power plane; and
a dielectric material between the first power plane and the second power plane; and
the second level includes one or more top dies electrically coupled to the package substrate.

13. The three-dimensional stacked die assembly of claim 12, wherein the one or more top dies are embedded in a molded compound.

14. The three-dimensional stacked die assembly of claim 12, wherein the second power plane extends to the second level such that the one or more top dies are embedded in the second power plane.

15. The three-dimensional stacked die assembly of claim 14, further including:
a first buffer layer between the second power plane and at least one of the package substrate and the first power plane; and
a second buffer layer between the second power plane and upper surfaces of the one or more top dies, wherein:
an interface between the first buffer layer and the second power plane, and an interface between the second buffer layer and the second power plane both have a non-flat configuration as compared with an interface between the first power plane and the package substrate, wherein some particles of the second power plane are at least in part embedded within indentations of the first buffer layer and the second buffer layer.

16. The three-dimensional stacked die assembly of claim 12, wherein the one or more top dies include a single die extending through an entirety of the second level.

17. A system including:
one or more processing units;
a memory coupled to the one or more processing units; and
a three-dimensional stacked die assembly including:
a package substrate;
a stack of material levels disposed above one another on the package substrate, the stack of material levels including a first level adjacent an upper surface of the package substrate, and a second level adjacent an upper surface of the first level, wherein:
the first level includes:
a base die adjacent to and electrically coupled to an upper surface of the package substrate;
a first power plane adjacent the upper surface of the package substrate and electrically coupled thereto, the first power plane further comprising metal and defining one or more recesses therein;
a second power plane comprising metal, the second power plane at least partially within the one or more recesses of the first power plane and having a lower surface that conforms with an upper surface of the first power plane; and
a dielectric material between the first power plane and the second power plane; and
the second level includes one or more top dies electrically coupled to the package substrate.

18. The system of claim 17, wherein the one or more top dies are embedded in a molded compound.

19. The system of claim 17, wherein the second power plane extends to the second level such that the one or more top dies are embedded in the second power plane.

20. The system of claim 17, wherein the one or more top dies include a single die extending through an entirety of the second level.

* * * * *